(12) United States Patent
Cho et al.

(10) Patent No.: US 6,753,227 B2
(45) Date of Patent: Jun. 22, 2004

(54) METHOD OF FABRICATING MOS TRANSISTORS

(75) Inventors: Chang-Hyun Cho, Seoul (KR); Gwan-Hyeob Koh, Seoul (KR); Ki-Nam Kim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/437,881

(22) Filed: May 13, 2003

(65) Prior Publication Data

US 2004/0033658 A1 Feb. 19, 2004

(30) Foreign Application Priority Data

Aug. 14, 2002 (KR) ........................................ 2002-48042

(51) Int. Cl.[7] ........................................... H01L 21/336
(52) U.S. Cl. ...................... 438/258; 438/286; 438/305
(58) Field of Search ................................ 438/589, 416, 438/384, 664, 227, 258, 450, 275, 305, 286

(56) References Cited

U.S. PATENT DOCUMENTS

| | | | | |
|---|---|---|---|---|
| 4,027,380 A | * | 6/1977 | Deal et al. | 438/227 |
| 5,141,882 A | * | 8/1992 | Komori et al. | 438/450 |
| 5,789,788 A | * | 8/1998 | Ema et al. | 257/371 |
| 5,960,319 A | * | 9/1999 | Iwata et al. | 438/664 |
| 6,051,471 A | * | 4/2000 | Gardner et al. | 438/286 |
| 6,162,694 A | * | 12/2000 | Cheek et al. | 438/305 |
| 6,255,702 B1 | * | 7/2001 | Iwata et al. | 257/384 |
| 6,362,511 B1 | * | 3/2002 | Mizushima et al. | 257/412 |
| 6,482,714 B1 | * | 11/2002 | Hieda et al. | 438/416 |
| 6,586,296 B1 | * | 7/2003 | Watt | 438/224 |
| 6,656,800 B2 | * | 12/2003 | Arai | 438/275 |
| 6,664,592 B2 | * | 12/2003 | Inumiya et al. | 438/589 |
| 6,680,230 B2 | * | 1/2004 | Arai et al. | 438/258 |

OTHER PUBLICATIONS

IBM J. Res. Develop. V.36, p. 170, 1992.
Formation of extended defects in silicon by high energy implantation of B and P, J.Y. Cheng, et al., J. Appl. Phys., v.80 (4), p. 2105, 1996.
Annealing behaviors of dislocation loops near projected range in high–does as implanted (001) Si, S.N. Hsu, et al., J. Appl. Phys. V. 86 (9), p. 4503, 1990.

* cited by examiner

*Primary Examiner*—John F. Niebling
*Assistant Examiner*—Walter L. Lindsay, Jr.
(74) *Attorney, Agent, or Firm*—Marger Johnson & McCollom, P.C.

(57) ABSTRACT

A method of fabricating a MOS transistor is provided. According to the method, a rapid thermal anneal is applied to a semiconductor substrate having active regions doped with well impurity ions and channel impurity ions. Thus, during implantation of the well and the channel impurity ions, crystalline defects resulting from the implantation can be cured by the rapid thermal anneal.

18 Claims, 5 Drawing Sheets

METHOD OF FABRICATING MOS TRANSISTORS

CROSS REFERENCE TO RELATED APPLICATIONS

This application claims benefit of priority from Korean Patent Application No. 2002-48042, filed on Aug. 14, 2002, the contents of which are hereby incorporated by reference in their entirety for all purposes.

BACKGROUND OF THE INVENTION

1. Technical Field of the Invention

The disclosure relates to methods of fabricating a semiconductor device and, more specifically, to methods of fabricating a MOS transistor.

2. Description of the Related Art

As semiconductor devices become more highly integrated, a giga-bit scale Dynamic Random Access Memory (DRAM) has been recently introduced. In the gigabit scale DRAM, a minimum design rule is reduced to 0.1 $\mu$m or less. This results in the following problems that degrade operation characteristics of the semiconductor devices during a fabrication process.

To highly integrate a semiconductor device, local oxidation of silicon (LOCOS) processes tend to be replaced by shallow trench isolation (STI) processes for forming a field oxide region. However, the STI process causes much more stress of the semiconductor substrate than the LOCOS process, and thus the semiconductor substrate often has damages such as extended defects. [IBM J. RES. DEVELOP. v.36, p.170, 1992]

In addition, as semiconductor devices are highly integrated, the channel length of a MOS transistor becomes shorter. Thus, short channel effects may occur and threshold voltages may decrease. In order to compensate for the decreasing threshold voltage, an impurity doping concentration of a channel region should be increased. An ion implantation process is widely used for forming source/drain regions of a MOS transistor. In the ion implantation process, if impurity doses exceed a critical value, combinations among silicon atoms may be broken, so that impurity-doped regions may be changed into an amorphous state. However, the broken combination of silicon atoms may be cured in a successive thermal process, so that the impurity-doped regions regain a crystalline structure containing impurities. In this case, atomic defects gather locally to form an electrically stable structure. Thus, discontinuous regions between the stable structures may be present, forming extended defects such as a dislocation or a stacking fault. ["Formation of extended defects in silicon by high energy implantation of B and P", J. Y. Cheng et. al., J. Appl. Phys., v.80 (4), p.2105, 1996], ["Annealing behaviors of dislocation loops near projected range in high-dose as implanted (001) Si", S. N. Hsu, et. al., J. Appl. Phys. v. 86 (9), p.4503, 1990]

These extended defects may disturb a normal operation of a semiconductor device.

DETAILED DESCRIPTION OF THE INVENTION

Figure 1:
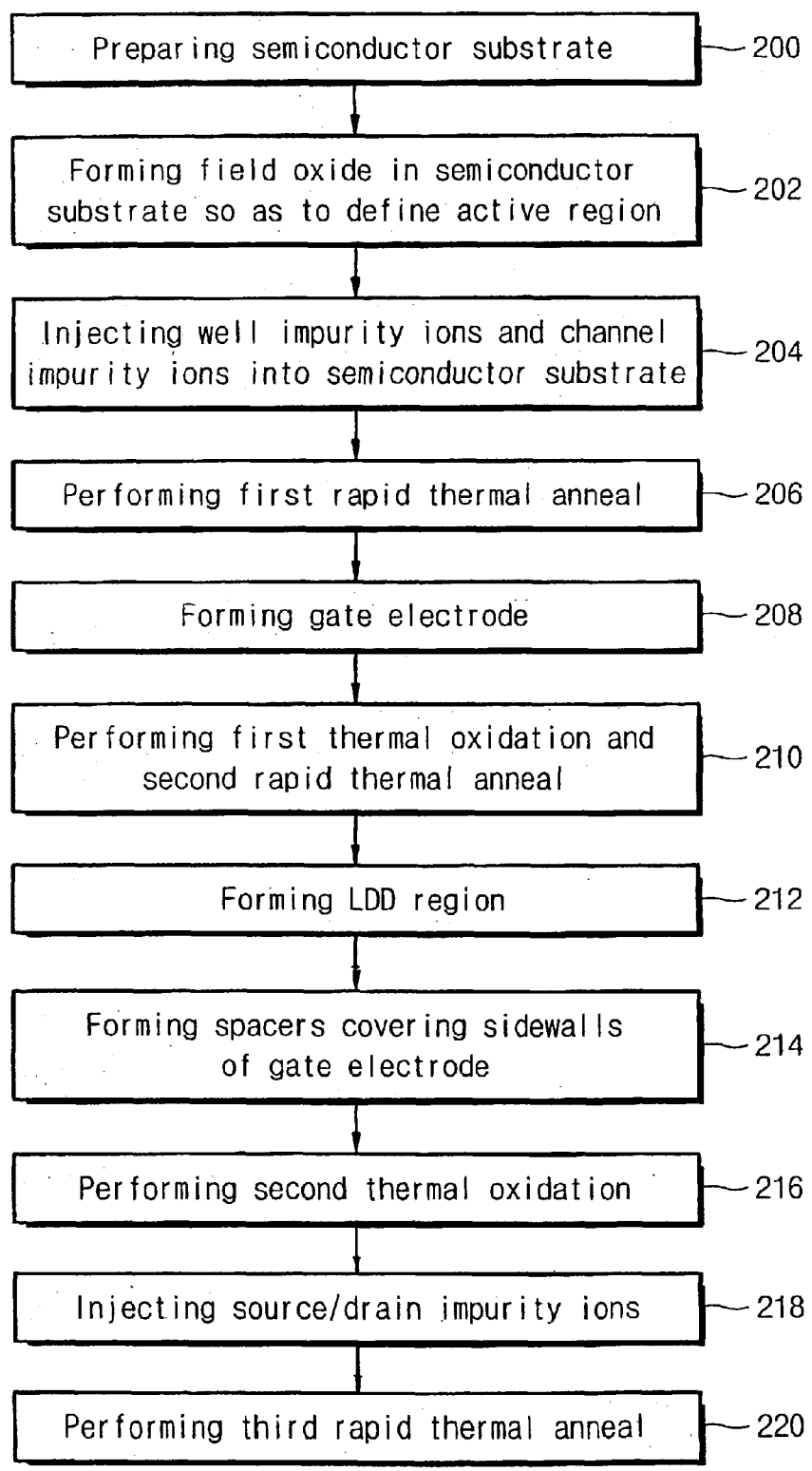
FIG. 1 is a flow chart showing steps of forming a MOS transistor in accordance with a preferred embodiment of the invention.

It is therefore an aspect of embodiments of the invention to provide methods of fabricating a MOS transistor that are capable of preventing and curing extended defects.

Embodiments of the invention are directed to methods of fabricating a MOS transistor where well impurity ions and channel impurity ions are implanted into active regions of a semiconductor substrate and then rapid thermal anneal is applied thereto.

More specifically, a method of fabricating a MOS transistor according to an embodiment of the invention is as follows. First, a field oxide is formed at a predetermined region of a semiconductor substrate to define active regions. Well impurity ions are implanted into the semiconductor substrate having the active region. Channel impurity ions are implanted into a surface of an active region. Using a rapid thermal anneal, the well impurity ions and the channel impurity ions are diffused to form a well region doped with the well impurity ions and a channel region doped with the channel impurity ions. A conductive layer is formed at the semiconductor substrate having the well and the channel regions. The conductive layer is patterned to form a gate pattern crossing over the active region. A thermal process is applied to the semiconductor substrate including the gate pattern, thereby curing etching damages of the semiconductor substrate. The etching damages result from patterning of the conductive layer. Using the gate pattern as an implantation mask, source/drain impurity ions are implanted into the active region. In addition, the source/drain impurity ions are diffused to form source/drain regions.

In this manner, implantation of the channel impurity ions may be performed before the well impurity ions are implanted. The thermal process involving the semiconductor substrate and the gate pattern may include thermally oxidizing the semiconductor substrate having the gate pattern in a reactor having oxygen ambient and applying the rapid thermal anneal to the semiconductor substrate.

After the semiconductor substrate including the gate pattern is thermally oxidized, impurity ions are implanted into the active region using the gate pattern as an implantation mask, thereby forming a lightly doped drain region. In addition, an insulating layer may be conformally stacked to cover sidewalls of the gate pattern, and then the insulating layer may be anisotropically etched to form spacers covering sidewalls of the gate pattern. Afterward, a semiconductor substrate including the spacers is thermally oxidized to cure etching damages of the semiconductor substrate caused by the anisotropic etching of the insulating layer.

A first aspect of a method of fabricating a MOS transistor in accordance with embodiments of the invention includes the following. A semiconductor substrate having a NMOS transistor region and a PMOS transistor region is prepared. A field oxide is formed at a predetermined region of the semiconductor substrate, thereby defining a first active region at the NMOS transistor region and a second active region at the PMOS transistor region. P well impurity ions and N well impurity ions are implanted into the semiconductor substrate of the NMOS transistor region and the PMOS transistor region, respectively. First channel ions are implanted into a surface of the first active region and second channel ions into a surface of the second active region. The well impurity ions and the channel impurity ions are diffused using a rapid thermal anneal, thereby forming a P well region and a N well region at the active regions of the NMOS transistor and the PMOS transistor, respectively. A first channel and a second channel region are simultaneously formed at surfaces of the first and the second active regions. A conductive layer is formed on the semiconductor substrate having the well regions and the channel regions. The conductive layer is patterned to form a first gate pattern crossing over the first active region and a second gate pattern crossing over the second active region. The thermal process is applied to the semiconductor substrate including the first and second gate patterns so as to cure etching damages of the semiconductor substrate caused by the patterning of the conductive layer. Using the first gate pattern as an implantation mask, N type impurity ions are implanted into the first active region. The N type impurity ions are diffused to form N type source/drain regions. Using the second gate pattern as an implantation mask, P type impurity ions are implanted into the second active region. The P type impurity ions are diffused to form P type source/drain regions.

Embodiments of the invention will now be described more fully hereinafter with reference to the accompanying drawings, in which preferred embodiments of the invention are shown. The invention may, however, be embodied in many different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification. In FIGS. 2A–2H, the letter "a" refers to NMOS transistor regions and the letter "b" refers to PMOS transistor regions.

Figure 2A:
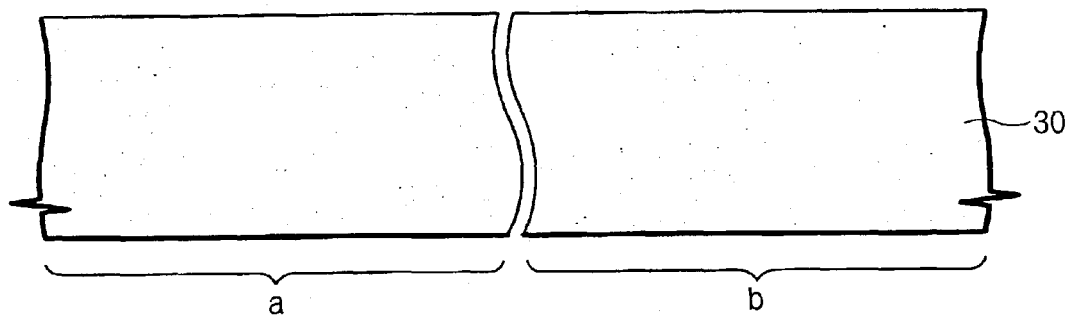
FIGS. 2A through 2H are cross-sectional views showing steps of forming a MOS transistor in accordance with a preferred embodiment of the invention.
Figure 2B:
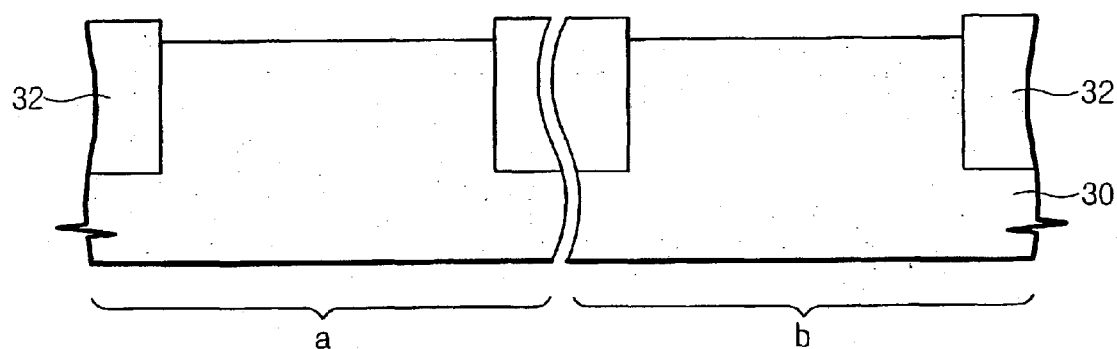

Referring to FIGS. 1, 2A, and 2B, a semiconductor substrate 30 is prepared, which has a NMOS transistor region "a" and a PMOS transistor region "b" (FIG. 1, process 200). Field oxides 32 are formed at a predetermined region to define a first active region and a second active region at the PMOS transistor region "b" (FIG. 1, process 202). The field oxides 32 are formed by a conventional process such as a shallow trench isolation process.

Figure 2C:
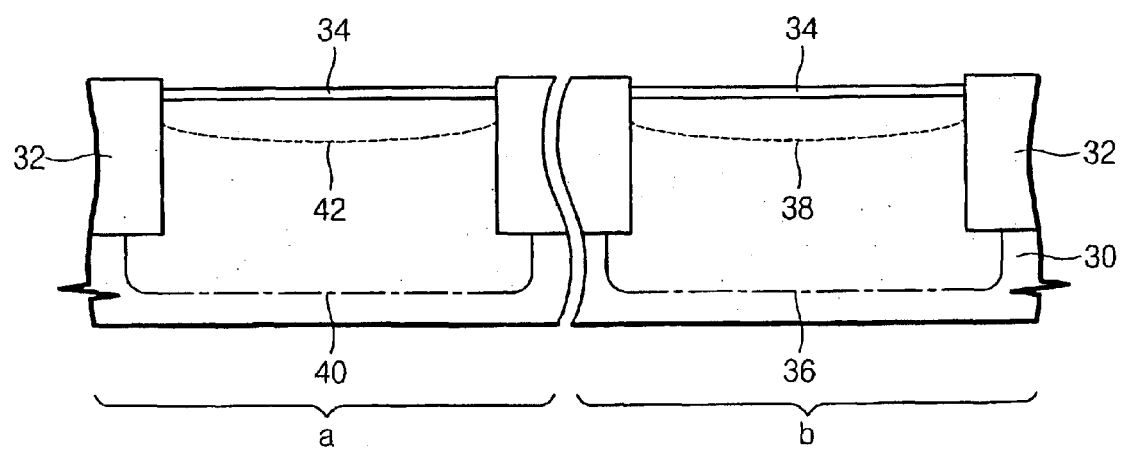

Referring to FIGS. 1 and 2C, sacrificial oxide layers 34 are formed on surfaces of a first active region and a second active region. The sacrificial oxide layers 34 may be formed of a thermal oxide layer. P well impurity ions and N well impurity ions are implanted into each semiconductor substrate of the NMOS transistor region "a" and the PMOS transistor region "b". Next, first channel impurity ions are implanted into the first active region and second channel impurity ions into the second active region (FIG. 1, process 204). The first and the second channel impurity ions may be implanted before the P well impurity ions and the N well impurity ions are implanted. The P well impurity ions may be boron ions. In this case, the boron ions are implanted with energy of 500 KeV at a dose of $1 \times 10^{13}$ atoms/cm$^2$. In addition, the N well impurity ions may be phosphorus ions. The phosphorus ions are implanted with energy of 800 KeV at a dose of $1 \times 10^{13}$ atoms/cm$^2$. Furthermore, the first and the second channel ions may be boron ions. In this case, the boron ions are implanted into surfaces of the first and second active regions with energy of 30 KeV at a dose of $5 \times 10^{12}$ atoms/cm$^2$. The kinds of P well impurity ions, N well impurity ions, first channel impurity ions, and second channel impurity ions may be changed according to the electrical characteristics of transistors that are intended to be formed. The doses and ion impurity energies thereof may also be changed.

A first rapid thermal anneal is applied to the semiconductor substrate implanted with the well impurity ions and the channel impurity ions, so that the well impurity ions and the channel impurity ions are diffused (FIG. 1, process 206). As a result, a P well region 40 is formed at the NMOS transistor region "a" of the semiconductor substrate and a N well region 36 is formed at the PMOS transistor region "b". The first channel region 42 is formed at a surface of the first active region and the second channel region 38 at a surface of the second active region. The first rapid thermal anneal for forming the well regions 36 and 40 and the channel regions 38 and 42 is preferably performed at a temperature of 950–1050° C. for 5–30 seconds. The first rapid thermal anneal serves to cure implantation damages of the semiconductor substrate 30 that are generated at the semiconductor substrate 30 when the well impurity ions and the channel impurity ions are implanted. That is to say, extended crystalline defects, which are generated at the semiconductor substrate during implantation of ions for forming the well regions 36 and 40 and the channel regions 38 and 42, can be cured by the first rapid thermal anneal. In addition, the impurity ions are activated in a short time by the first rapid thermal anneal. Thus, the surface concentration of the channel region is prevented from rapidly decreasing. As a result, the threshold voltage may be prevented from decreasing without increasing impurity doses during the ion implantation process.

Figure 2D:
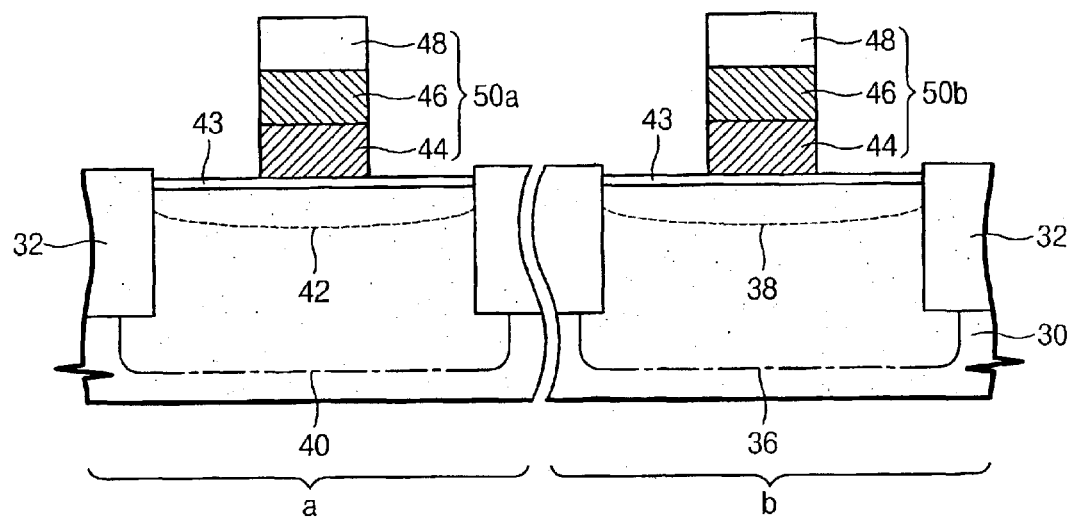

Referring to FIGS. 1 and 2D, after removing a sacrificial oxide layer 34, a gate oxide layer 43 is formed on surfaces of a first active region and a second active region. A polysilicon layer doped with N type impurities is deposited to a thickness of about 1000 Å on an entire surface of the semiconductor substrate 30 having the gate oxide layer 43. In addition, tungsten silicide and silicon nitride layers are subsequently deposited on the polysilicon layer to a thickness of 1000 Å, respectively. The silicon nitride layer, the tungsten silicide layer, and the polysilicon layer are successively patterned to form first and second gate patterns 50a and 50b including a gate electrode including a polysilicon pattern 44, a tungsten silicide pattern 46, and a silicon nitride pattern 48 on a first and a second active region, respectively (FIG. 1, process 208).

To cure damages to the sidewalls of the gate patterns 50a and 50b and the gate oxide layer 43 resulting from the patterning, a first thermal oxidation process and a second rapid thermal anneal are successively applied to the semiconductor substrate 30 with the first and the second gate patterns 50a and 50b (FIG. 1, process 210). The first thermal oxidation process is preferably performed in a reactor having oxygen ambient, at a temperature of 800–900° C. for 10–30 seconds. By the first thermal oxidation process, oxide layers (not shown) are formed on sidewalls of the polysilicon pattern 44 and the tungsten silicide pattern 46 composing the gate patterns 50a and 50b, thereby curing damages of the polysilicon pattern 44 and the tungsten silicide pattern 46. In addition, the first thermal oxidation process makes the gate oxide layer 43 thicker, protecting the semiconductor substrate 30 underneath. The second rapid thermal anneal is preferably performed at a temperature of 950–1050° C. for about 20 seconds. The second rapid thermal anneal may suppress abnormal growths of extended defects that may be present at the semiconductor substrate 30. The extended defects may exist on the semiconductor substrate.

The second rapid thermal anneal also strengthens the gate oxide layer 43 and recrystallizes the tungsten silicide pattern 46 to decrease the gate resistance.

Figure 2E:
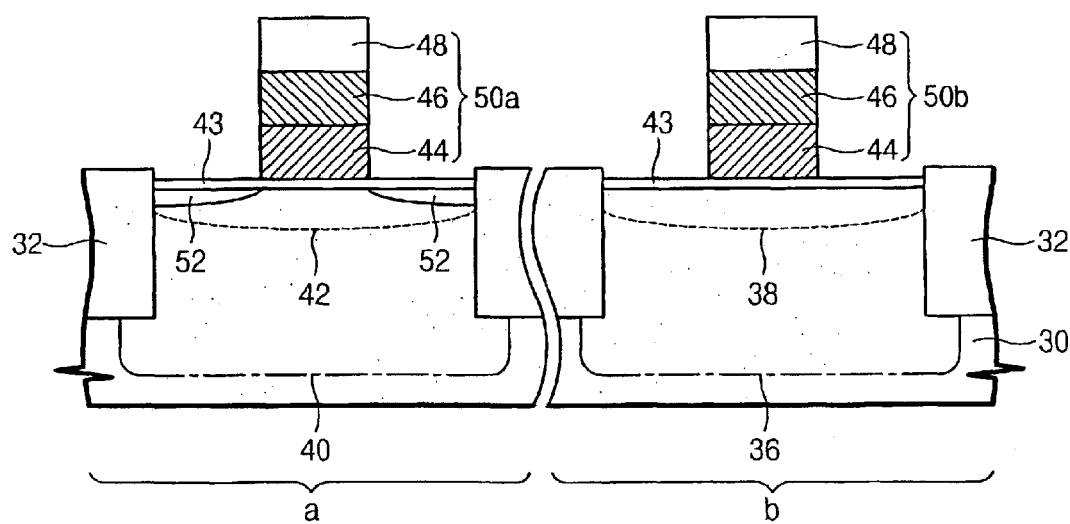

Referring to FIGS. 1 and 2E, using the first gate pattern 50a as an implanting mask, N type impurities are implanted into the NMOS transistor region "a" to form lightly doped drain regions 52 (FIG. 1, process 212). More particularly, the second gate pattern 50b is covered with a photoresist pattern and then arsenic ions (i.e., a kind of N type impurity) are implanted into the first active region with energy of 20 KeV at a dose of $1 \times 10^{13}$ atoms/cm$^2$ using the first gate pattern 50a as an implantation mask. Accordingly, lightly doped drain regions 52 are formed. Afterwards, the photoresist pattern is removed.

Figure 2F:
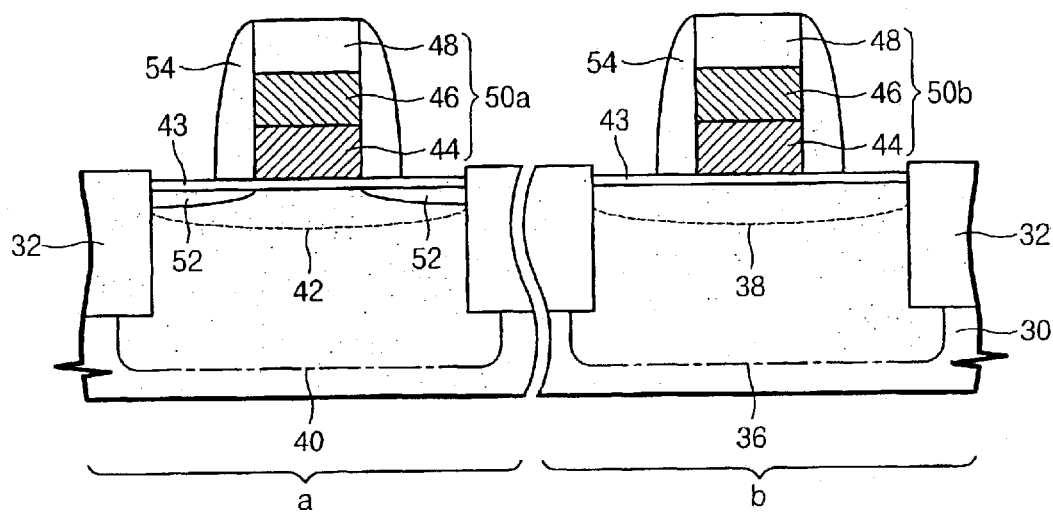

Referring to FIGS. 1 and 2F, an insulating layer such as silicon nitride is conformally deposited to a thickness of 400–700 Å on an entire surface of the semiconductor substrate 30 including the first and the second gate patterns 50a and 50b. An anisotropic etching process or dry etch process is applied to the insulating layer to form spacers 54 covering sidewalls of the first and the second gate patterns 50a and 50b (FIG. 1, process 214). To cure the gate oxide layer 43 attacked by the etching process, a second thermal oxidation process may be applied to the semiconductor substrate 30 including the spacers 54 (FIG. 1, process 216). In this case, the second thermal oxidation process is preferably performed in a reactor having oxygen ambient, at a temperature of 800–900° C., and for 10–25 seconds.

Figure 2G:
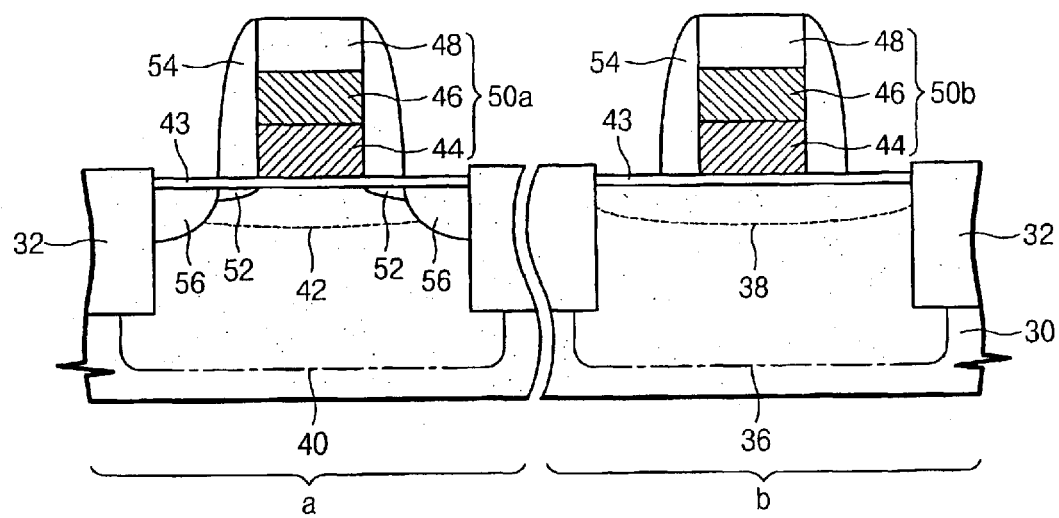

Referring to FIGS. 1 and 2G, the second gate pattern 50b is covered with a photoresist pattern and then source/drain impurity ions are implanted into the first active region using the first gate pattern 50a as an implantation mask. In this case, arsenic ions are used for the source/drain ions and implanted with energy of 20 KeV at a dose of $2 \times 10^{15}$ atoms/cm$^2$ (FIG. 1, process 218). The photoresist pattern is removed. The arsenic ions used for forming the source/drain regions 56 of the NMOS transistor region "a" cause vacancy defects during the ion implantation process because the arsenic ion is bigger than the silicon atom in size. The vacancy defect may grow as an extended defect in a successive thermal process. To prevent and cure this, a third rapid thermal anneal is applied to the semiconductor substrate 30 implanted with the arsenic ions (FIG. 1, process 220). The third rapid thermal anneal may be preferably performed at a temperature of 1000–1050° C. for less than 20 seconds.

Figure 2H:
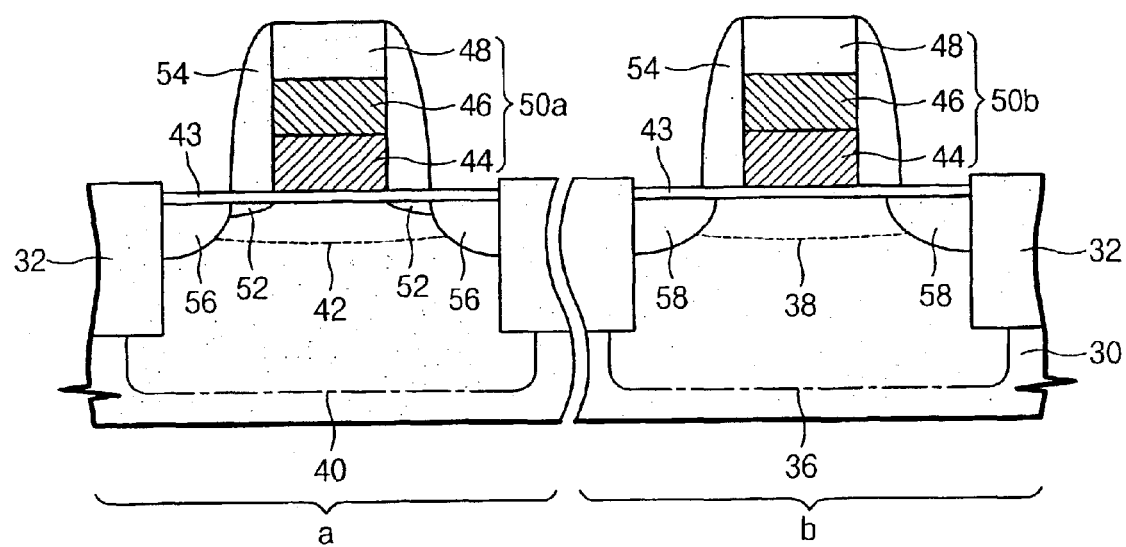

Referring to FIG. 2H, the first gate pattern 50a is covered with a photoresist pattern and then BF$_2$ ions are implanted into the second active region with energy of 20 KeV at a dose of $2 \times 10^{15}$ atoms/cm$^2$ using the second gate pattern 50b as an ion implantation mask. This implantation process forms source/drain regions 58 in the PMOS transistor region "b". A thermal process may be performed in order to activate BF$_2$ ions that are implanted. The thermal process may be preferably performed at a temperature of 800–900° C. for 10–50 seconds.

According to a method of forming a MOS transistor with respect to embodiments of the invention, the following can be achieved. First, after implanting well impurity ions and channel impurity ions into a semiconductor substrate, damages of well and channel regions can be cured and a threshold voltage can be increased by a rapid thermal anneal. Second, after forming a gate pattern, damages of the semiconductor substrate resulting from formation of the gate pattern can be cured by a thermal process. Third, after implanting source/drain impurity ions, a rapid thermal anneal can cure extended defects of the source/drain regions and improve reliability of the semiconductor device.

What is claimed is:

1. A method of fabricating a MOS transistor comprising:

forming a field oxide at a predetermined area of a semiconductor substrate that defines an active region;

implanting well impurity ions into a semiconductor substrate having the active region;

implanting channel impurity ions into a surface of the active region;

diffusing the well impurity ions and the channel impurity ions using a rapid thermal anneal and forming a well area doped with the well impurity ions and a channel area doped with the channel impurity ions;

forming a conductive layer on the semiconductor substrate having the well region and the channel region;

forming a gate pattern crossing over the active region by patterning the conductive layer;

curing etching damages of the semiconductor substrate generated during patterning of the conductive layer by applying a thermal process to the semiconductor substrate including the gate pattern;

implanting source/drain impurity ions into the active region using the gate pattern as an implantation mask; and forming source/drain regions by diffusing the source/drain impurity ions.

2. The method of claim 1, wherein implanting channel impurity ions into a surface of the active region is performed before implanting well impurity ions.

3. The method of claim 1, wherein the rapid thermal anneal is performed at a temperature of 950–1050° C. for approximately 50 seconds.

4. The method of claim 1, wherein applying a thermal process to the semiconductor substrate including the gate pattern comprises:

thermally oxidizing the semiconductor substrate including the gate pattern in a reactor having oxygen ambient; and applying a rapid thermal anneal to the thermally oxidized semiconductor substrate.

5. The method of claim 4, wherein thermally oxidizing the semiconductor substrate including the gate pattern is performed at a temperature of 800–900° C. for approximately 10–20 seconds.

6. The method of claim 4, wherein applying the rapid thermal anneal to the thermally oxidized semiconductor substrate is performed at a temperature of 950–1050° C. for less than 20 seconds.

7. The method of claim 1, wherein diffusing the source/drain impurities is performed by rapid thermal anneal at a temperature of 1000–1050° C. for approximately 20 seconds.

8. The method of claim 1, after applying a thermal process to the semiconductor substrate including the gate pattern, the method further comprising:

forming a lightly doped drain region by implanting impurities in the active region using the gate pattern as an ion implantation mask;

conformally depositing an insulating layer to cover the gate pattern;

anisotropically etching the insulating layer to form spacers covering sidewalls of the gate pattern; and curing etching damages of the semiconductor substrate resulting from the anisotropic etching process with respect to the insulating layer by thermally oxidizing the semiconductor substrate including the spacers.

9. The method of claim 8, wherein thermally oxidizing the semiconductor substrate including the spacers is performed at a temperature of 800–900° C. for 10–20 seconds.

10. A method of fabricating a MOS transistor comprising:

preparing a semiconductor substrate having a NMOS transistor region and a PMOS transistor region;

forming a field oxide at a predetermined region that defines a first active region at the NMOS transistor region and a second active region at the PMOS transistor region, respectively;

implanting P well impurity ions into a semiconductor substrate of the NMOS transistor region and N well impurity ions into a semiconductor substrate of the PMOS transistor region;

implanting first channel impurities and second channel impurities into each surface of the first active region and the second active region, respectively;

forming a P well region at the NMOS transistor region and a N well region at the PMOS transistor region by diffusing the well impurity ions and the channel impurity ions by a rapid thermal anneal and simultaneously forming a first channel at a surface of the first active region and a second channel region at a surface of the second active region;

forming a conductive layer on the semiconductor substrate having the well regions and the channel regions;

forming a first gate pattern crossing over the first active region and a second gate pattern crossing over the second active region by patterning the conductive layer;

curing etching damages of the semiconductor substrate resulting from patterning of the conductive layer by applying a thermal process to the semiconductor substrate including the first and the second gate patterns;

implanting N type impurity ions into the first active region using the first gate pattern as an implantation mask;

forming N type source/drain regions by diffusing the N type impurity ions;

implanting P type impurity ions into the second active region using the second gate pattern as an implantation mask; and forming P type source/drain regions by diffusing the P type impurity ions.

11. The method of claim 10, wherein implanting first and second channel impurities is performed before implanting the P well and the N well impurity ions.

12. The method of claim 10, wherein the rapid thermal anneal is performed at a temperature of 950–1050° C. for approximately 50 seconds.

13. The method of claim 10, wherein applying a thermal process to the semiconductor substrate including the first and the second gate patterns comprises:

thermally oxidizing the semiconductor substrate including the first and the second gate patterns in a reactor having oxygen ambient; and applying a rapid thermal anneal to the semiconductor substrate that is thermally oxidized.

14. The method of claim 13, wherein thermally oxidizing the semiconductor substrate including the first and the second gate patterns is performed at a temperature of 800–900° C. for approximately 10–20 seconds.

15. The method of claim 13, wherein the applying a rapid thermal anneal to the semiconductor substrate that is thermally oxidized is performed at a temperature of 950–1050° C. for approximately 20 seconds.

16. The method of claim 10, wherein diffusing the N type impurity ions is performed by a rapid thermal anneal at a temperature of 1000–1050° C. for approximately 20 seconds.

17. The method of claim 10, after applying a thermal process to the semiconductor substrate including the first and the second gate patterns, the method further comprising:

implanting N type impurity ions into the first active region using the first gate pattern as an implantation mask, thereby forming a lightly doped drain region;

conformally depositing an insulating layer covering the first and the second gate patterns;

forming spacers that cover sidewalls of the first and the second gate patterns by anisotropically etching the insulating layer;

curing etching damages of the semiconductor substrate resulting from the anisotropical etching process with respect to of the insulating layer by thermally oxidizing the semiconductor substrate including the spacers.

18. The method of claim 17, wherein thermally oxidizing the semiconductor substrate including the spacers is performed at a temperature 800–900° C. for approximately 10–20 seconds.

* * * * *